(12) United States Patent
Zhang et al.

(10) Patent No.: US 11,424,125 B2
(45) Date of Patent: Aug. 23, 2022

(54) ANGLED ION IMPLANT TO REDUCE MOSFET TRENCH SIDEWALL ROUGHNESS

(71) Applicant: Applied Materials, Inc., Santa Clara, CA (US)

(72) Inventors: Qintao Zhang, Mt Kisco, NY (US); Wei Zou, Lexington, MA (US); Hans-Joachim L. Gossmann, Summit, NJ (US)

(73) Assignee: Applied Materials, Inc., Santa Clara, CA (US)

( * ) Notice: Subject to any disclaimer, the term of this patent is extended or adjusted under 35 U.S.C. 154(b) by 81 days.

(21) Appl. No.: 17/148,006

(22) Filed: Jan. 13, 2021

(65) Prior Publication Data

US 2022/0223416 A1    Jul. 14, 2022

(51) Int. Cl.
*H01L 21/28* (2006.01)
*H01L 29/66* (2006.01)
*H01L 21/04* (2006.01)
*H01L 21/8234* (2006.01)

(52) U.S. Cl.
CPC ...... *H01L 21/047* (2013.01); *H01L 21/28185* (2013.01); *H01L 21/823468* (2013.01); *H01L 29/66734* (2013.01)

(58) Field of Classification Search
CPC ............ H01L 21/047; H01L 21/28185; H01L 21/823468; H01L 29/66734
See application file for complete search history.

(56) References Cited

U.S. PATENT DOCUMENTS 10,381,444 B2 *   8/2019   Yamamoto ......... H01L 29/1608

* cited by examiner

*Primary Examiner* — David Vu
(74) *Attorney, Agent, or Firm* — KDB Firm PLLC

(57) ABSTRACT

Disclosed herein are methods for reducing MOSFET trench sidewall surface roughness. In some embodiments, a method includes providing a device structure including a well formed in an epitaxial layer, forming a plurality of trenches through the well and the epitaxial layer, and implanting the device structure to form a treated layer along a sidewall of just an upper portion of the device structure within each of the plurality of trenches. The method may further include etching the device structure to remove the treated layer.

20 Claims, 5 Drawing Sheets

ANGLED ION IMPLANT TO REDUCE MOSFET TRENCH SIDEWALL ROUGHNESS

FIELD OF THE DISCLOSURE

The present embodiments relate to semiconductor device patterning, and more particularly, to forming MOSFETs using an angled ion implant to reduce trench sidewall roughness.

BACKGROUND OF THE DISCLOSURE

Low voltage power metal-oxide-semiconductor field-effect transistors (MOSFETs) are often used in load switching applications where reduction of the on-resistance ($R_{ds}$) of the device is desirable. In some applications, the $R_{ds}A$ of the device is minimized, where $R_{ds}A$ is the on-resistance of the device multiplied by the active area of the device. Additionally, low voltage power MOSFETs are commonly used in high frequency DC-DC applications.

Trench-based MOSFETs are often used to reduce $R_{ds}A$ of the device. After trench formation, an implant anneal process is often performed, which increases sidewall surface roughness within the trenches. However, it is difficult to repair this surface roughness because chemical mechanical planarization (CMP) cant be used in the trenches.

Accordingly, improved trench formation approaches are needed to maximize scalability.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one aspect, a method may include providing a device structure including a well formed in an epitaxial layer, forming a plurality of trenches through the well and the epitaxial layer, and implanting the device structure to form a treated layer along a sidewall of just an upper portion of the device structure within each of the plurality of trenches. The method may further include etching the device structure to remove the treated layer, and forming a gate oxide layer within each of the plurality of trenches.

In another aspect, a method of forming a MOSFET may include providing a device structure including a well formed in an epitaxial layer, forming a plurality of trenches through the well and the epitaxial layer, and implanting the plurality of trenches with an ion implant delivered to the device structure at a non-zero angle of inclination relative to a perpendicular extending from a top surface of the device structure. The ion implant forms a treated layer along a well sidewall within each of the plurality of trenches. The method may further include etching the device structure to remove the treated layer from the well sidewall, and forming a gate oxide layer within each of the plurality of trenches.

In yet another aspect, a method for reducing MOSFET trench sidewall surface roughness may include providing a device structure including a well formed in an epitaxial layer, forming a plurality of trenches through the well and the epitaxial layer, and implanting the device structure to form a treated layer along a sidewall of just an upper portion of the device structure within each of the plurality of trenches. The method may further include etching the device structure to remove the treated layer selective to a top surface of the epitaxial layer.

BRIEF DESCRIPTION OF THE DRAWINGS

The accompanying drawings illustrate exemplary approaches of the disclosure, including the practical application of the principles thereof, as follows.

Figure 1A:
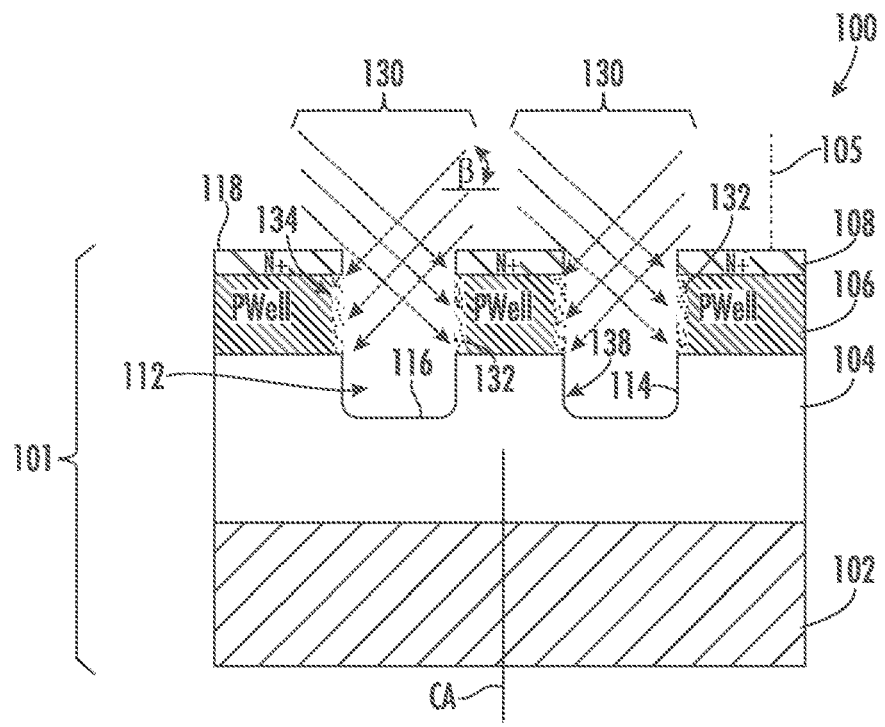
FIGS. 1A-1B are cross-sectional side views of a device structure during an angled ion implant, according to embodiments of the present disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods and devices in accordance with the present disclosure will now be described more fully hereinafter with reference to the accompanying drawings, where various embodiments are shown. The methods and devices may be embodied in many different forms and are not to be construed as being limited to the embodiments set forth herein. Instead, these embodiments are provided so the disclosure will be thorough and complete, and will fully convey the scope of the methods to those skilled in the art.

Embodiments described herein advantageously enable smooth trench sidewall surfaces for MOSFET devices. In some embodiments, an implantation step is added to a SiC trench MOSFET process flow to improve surface roughness caused by high temperature annealing steps. More specifically, the implantation generates a controllable amorphous layer, which may be etched to remove damage caused by the implant, thus making the sidewall(s) smoother.

Figure 1B:
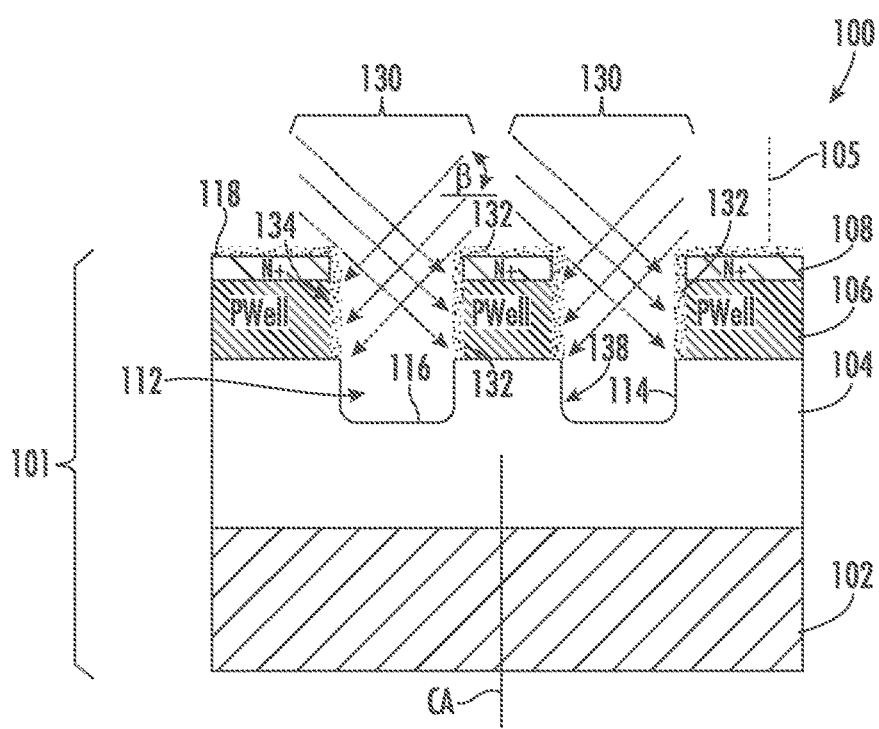

FIGS. 1A-1B are side cross-sectional views of a semiconductor device structure (hereinafter "device") 100, such as a MOSFET, according to one or more embodiments described herein. The device 100 may include a device structure 101 having a substrate 102, an epitaxial layer 104, a well 106, and a source region or layer 108. Although non-limiting, the epitaxial layer 104 may be a silicon carbide (SiC) n-type drift layer, the well 106 may be a p-type well, and the source layer 108 may be an N+ source layer. In other embodiments, the source layer 108 may include N+ and P+ regions next to each other, wherein P+ serves as a PWell contact and N+ serves as the source layer. Shown as a single layer, the epitaxial layer 104 may include multiple layers in other embodiments. As known, the well 106 may be formed using a plurality of doping steps or epitaxy steps.

As further shown, a plurality of trenches 112 may be formed in the device 100, e.g., using one or more blocking and vertical etch processes to form a sidewall 114 with a slope of approximately 80 to 90 degrees relative to a plane defined by a top surface 118 of the device structure 101. The trenches 112 may be defined, in part, by the sidewall 114 and a bottom surface 116. As demonstrated, the trenches 112 may be formed after the well 106 and the source layer 108 are formed.

As further shown, an ion implant 130 may be performed to the device 100 to form a treated layer 132 along an upper portion 134 of each trench 112, wherein the treated layer 132 may be an amorphized area/layer or implanted layer of the well 106. In various embodiments, the treated layer 132 may be formed along the well 106, as shown in FIG. 1A, or along both the well 106 and the source layer 108, as shown in FIG. 1B. By also implanting the source layer 108, the source layer 108 may become smoother following a subsequent etch process, which improves contact yield and controls silicide thickness variation. Furthermore, a smoother sidewall 114 along the source layer 108 improves channel mobility. In both embodiments, the treated layer 132 is not formed along the epitaxial layer 104 in a lower portion 138 of the trenches 112. Although non-limiting, the ion implant 130 may be a beamline implant delivered at a pre-defined angle, a pre-defined energy, a predefined dose, etc. For example, one or more implantation species, (e.g., Al, Ar, As) can be used to control surface roughness and etch depth of a subsequent etch.

Furthermore, the ion implant 130 may be delivered to the device structure 101 at a non-zero angle of inclination β relative to a perpendicular 105 extending from the top surface 118 of the device structure 101. The angle of inclination β may be selected so the ion implant 130 does not impact the epitaxial layer 104. The angle of inclination β may vary in other embodiments, e.g., by +/−45° so the ion implant 130 impacts more or less of the sidewall 114. Still furthermore, the device structure 101 may be rotated during or between successive implants, e.g., about a central axis 'CA'. Although non-limiting, the device structure 101 may be rotated between each implant process by 45°, 90°, 180°, etc.

Figure 2:
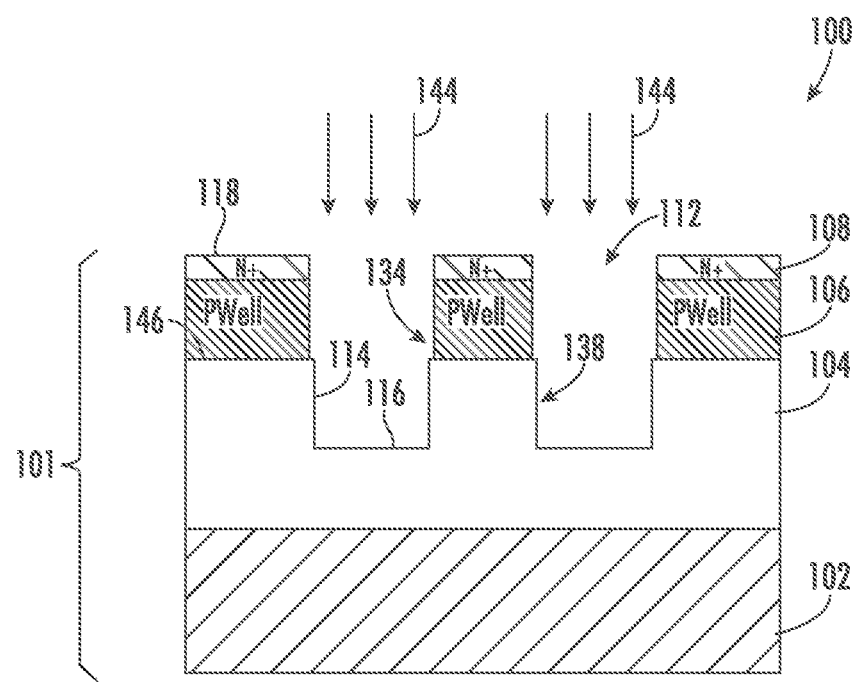
FIG. 2 is a side cross-sectional view illustrating the device following removal of a treated layer from the device structure, according to embodiments of the present disclosure.

As shown in FIG. 2, an etch process 144 may be performed on the device structure 101 to remove the treated layer 132 from the upper portion of the sidewall 114 of the trenches 112. More specifically, in some embodiments, the etch process 144 is a wet etch operable to remove the treated layer 132 along the well 106, selective to a top surface 146 of the epitaxial layer 104. Once the treated layer 132 is removed, a smoother sidewall 114 along the well 106 remains.

Figure 3:
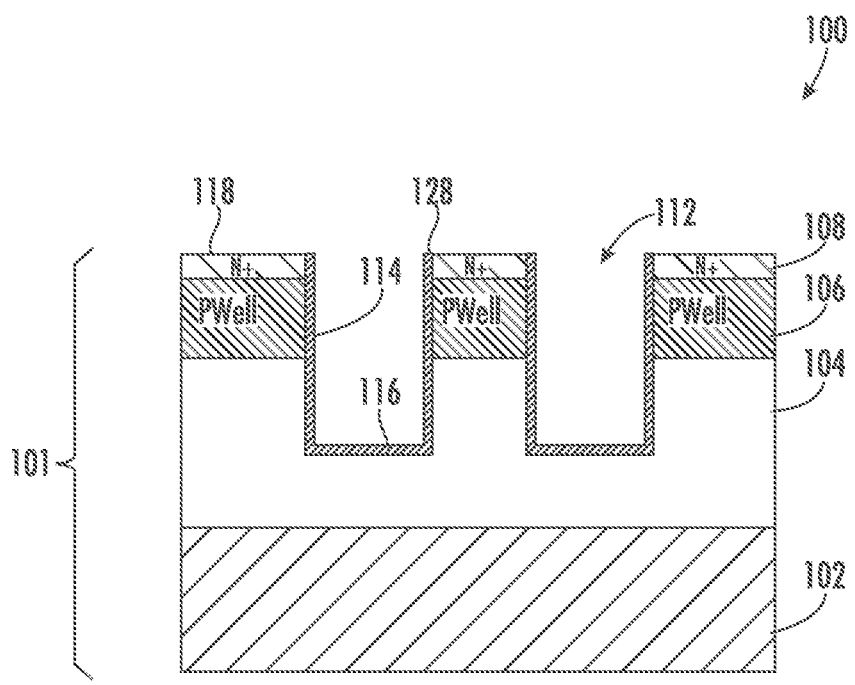
FIG. 3 is a side cross-sectional view illustrating the device including a sacrificial oxide within a plurality of trenches, according to embodiments of the present disclosure.

As shown in FIG. 3, an optional sacrificial oxide layer 128 may be formed over the device 100 including within the trenches 112. In some embodiments, the sacrificial oxide layer 128 is formed along the sidewall 114 and the bottom surface 116 of the trenches. Although non-limiting, the sacrificial oxide layer 128 may be approximately ~10 nm thick.

Figure 4:
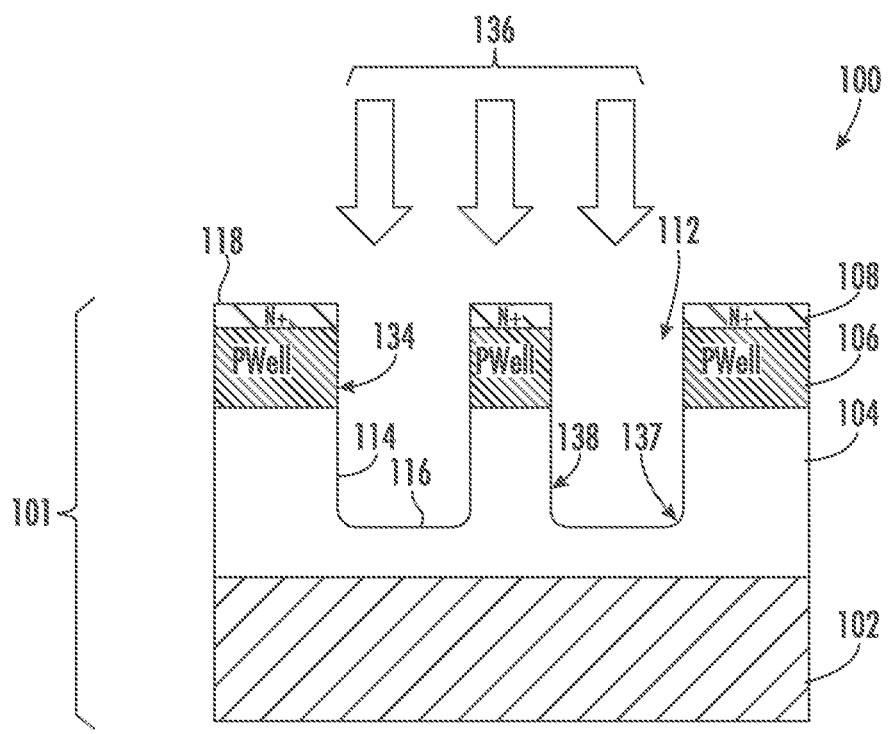
FIG. 4 is a side cross-sectional view illustrating an anneal process to the device structure, according to embodiments of the present disclosure.

As shown in FIG. 4, the sacrificial oxide layer 128 may be removed (e.g., etched), and the device structure 101 may be annealed 136 to form rounded bottom corners 137 between the sidewall 114 and the bottom surface 116. In some embodiments, the anneal 136 may be a hydrogen anneal.

Figure 5:
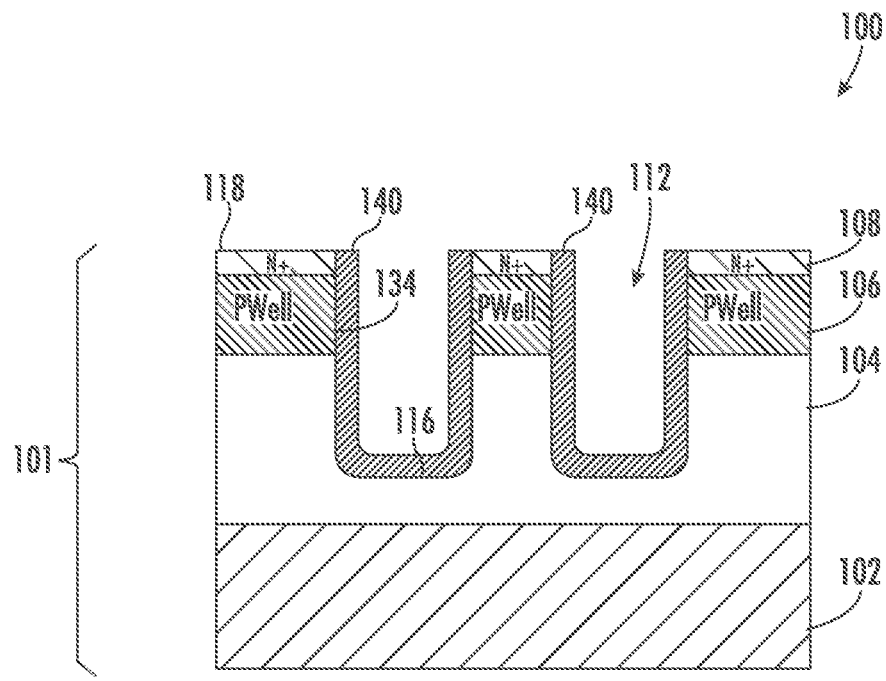
FIG. 5 is a side cross-sectional view illustrating formation of a gate oxide layer over the device structure, according to embodiments of the present disclosure.

Next, as shown in FIG. 5, a gate oxide layer 140 may be formed over the device structure 101, including within each of the trenches 112. Although not shown, the gate oxide layer 140 may also be formed over the top surface 118 of the device structure 101 and then removed, e.g., via CMP. In some embodiments, the gate oxide layer 140 is formed by a thermal oxidation process to device 100 to form a uniform-thickness oxide along the sidewall 114 and the bottom surface 116.

Figure 6:
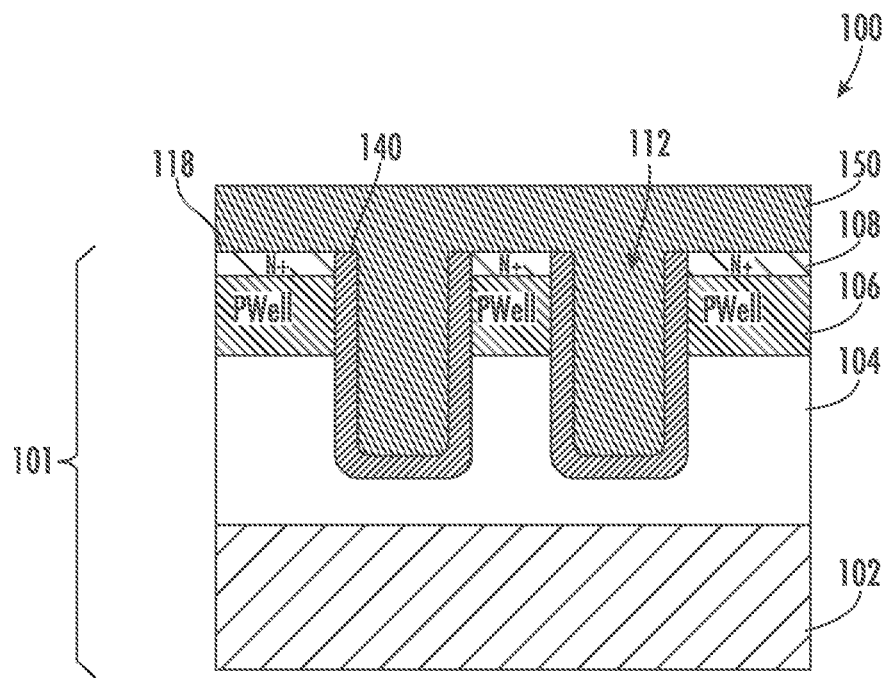
FIGS. 6-7 are side cross-sectional views illustrating formation of a gate material, according to embodiments of the present disclosure.
Figure 7:
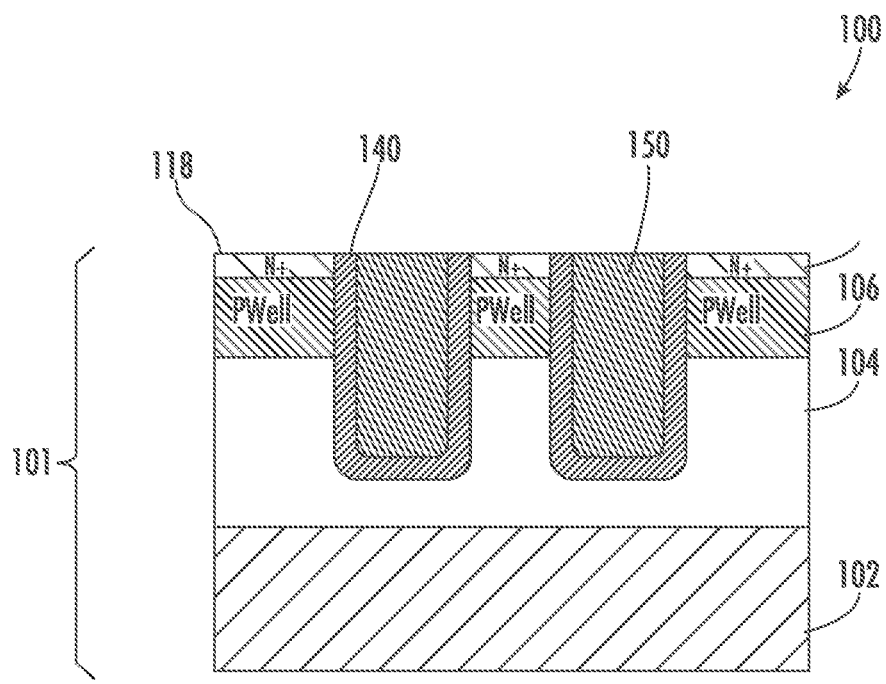

As demonstrated in FIG. 6, a gate material 150 may be formed over the device structure 101 including within the trenches 112. In some embodiments, the gate material 150 may be a polysilicon gate refill deposited over the device 100 and then planarized (e.g., via CMP) or etched back selective to the top surface 118 of the device structure 101, as shown in FIG. 7. Although non-limiting, in various embodiments, the gate material 150 may be a p-type or n-type polysilicon, which is doped.

In some embodiments, a second gate material (not shown) may be formed over the gate material 150 to form a split gate, wherein the gate material is separated from the second gate material by an isolation layer. Although non-limiting, the gate material and the second gate material may be different materials, wherein the first gate material may be a p-type polysilicon, and the second gate material may be an active n-type polysilicon.

In sum, embodiments herein disclose a device and associated process flow for forming a MOSFET. By implanting the well along the sidewall of each trench to form a treated layer, which is subsequently etched, trench surface roughness is minimized, which improves overall MOSFET device scaling.

Figure 8:
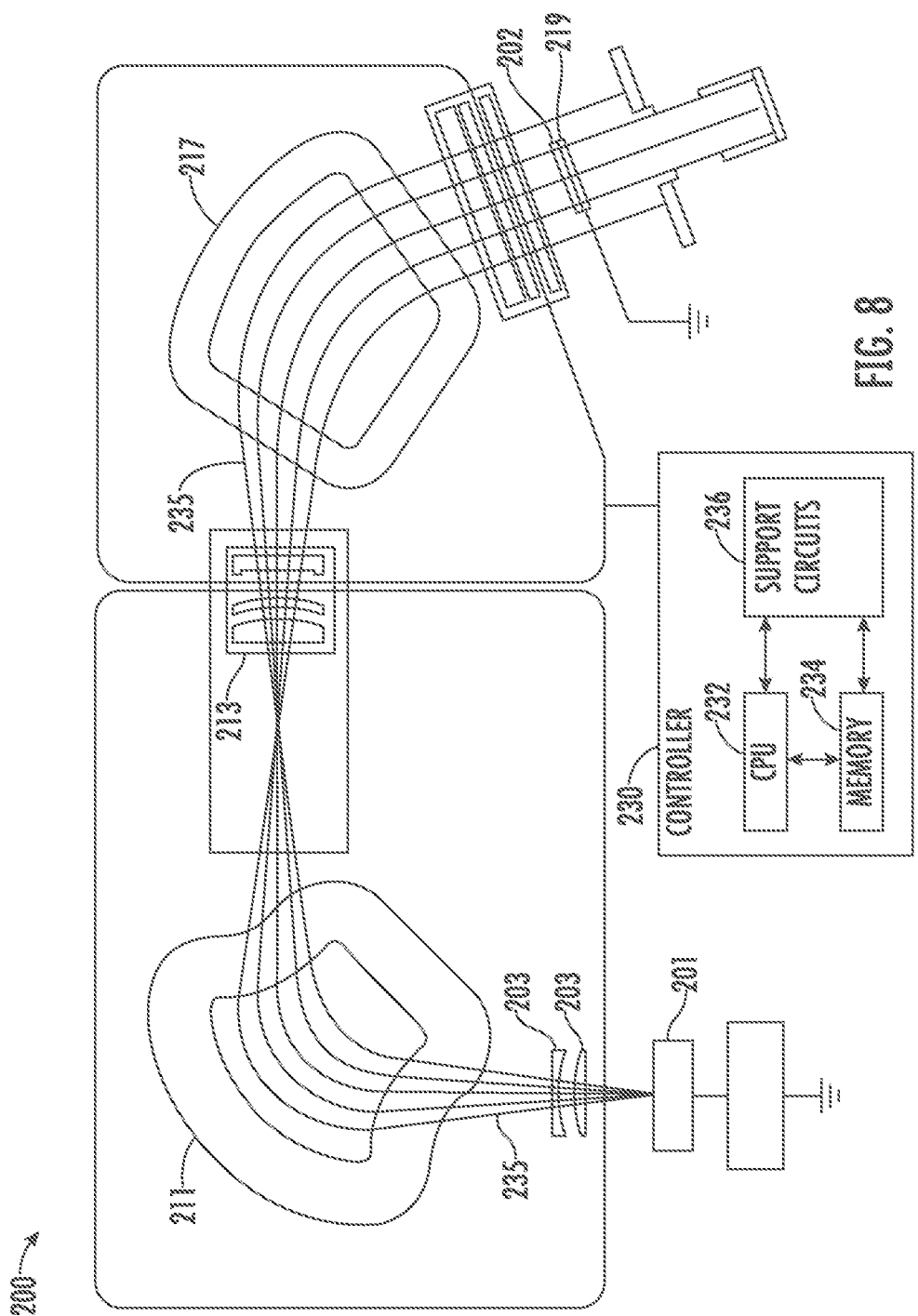
FIG. 8 illustrates a schematic diagram of a processing apparatus according to embodiments of the present disclosure.

FIG. 8 illustrates a schematic diagram of a processing apparatus 200 useful to perform processes described herein. One example of a beam-line ion implantation processing apparatus is the Varian VIISTA® Trident, available from Applied Materials Inc., Santa Clara, Calif. The processing apparatus 200 may include an ion source 201 for generating ions. For example, the ion source 201 may provide an ion implant, such as the ion implant 130 demonstrated in FIG. 1 for forming the treated layers 132 in the device 100. The ion source 201 may also provide an ion etch, such as the etch process 144 of FIG. 2. The processing apparatus 200 may also include a series of beam-line components. Examples of beam-line components may include extraction electrodes 203, a magnetic mass analyzer 211, a plurality of lenses 213, and a beam parallelizer 217. The processing apparatus 200 may also include a platen 219 for supporting a substrate 202 to be processed. The substrate 202 may be the same as the substrate 102 described above. The substrate 202 may be moved in one or more dimensions (e.g. translate, rotate, tilt, etc.) by a component sometimes referred to as a "roplat" (not shown). It is also contemplated that the processing apparatus 200 may be configured to perform heated implantation processes to provide for improved control of implantation characteristics, such as the ion trajectory and implantation energy utilized to dope the substrate.

In operation, ions of the desired species, for example, dopant ions, are generated and extracted from the ion source 201. Thereafter, the extracted ions 235 travel in a beam-like state along the beam-line components and may be implanted in the substrate 202. Similar to a series of optical lenses that manipulate a light beam, the beam-line components manipulate the extracted ions 235 along the ion beam. In such a manner, the extracted ions 235 are manipulated by the beam-line components while the extracted ions 235 are directed toward the substrate 202. It is contemplated that the apparatus 200 may provide for improved mass selection to implant desired ions while reducing the probability of undesirable ions (impurities) being implanted in the substrate 202.

In some embodiments, the processing apparatus 200 can be controlled by a processor-based system controller such as controller 230. For example, the controller 230 may be configured to control beam-line components and processing parameters associated with beam-line ion implantation processes. The controller 230 may include a programmable central processing unit (CPU) 232 that is operable with a memory 234 and a mass storage device, an input control unit, and a display unit (not shown), such as power supplies, clocks, cache, input/output (I/O) circuits, and the like, coupled to the various components of the processing apparatus 200 to facilitate control of the substrate processing. The controller 230 also includes hardware for monitoring substrate processing through sensors in the processing apparatus 200, including sensors monitoring the substrate position and sensors configured to receive feedback from and control a heating apparatus coupled to the processing apparatus 200. Other sensors that measure system parameters such as substrate temperature and the like, may also provide information to the controller 230.

To facilitate control of the processing apparatus 200 described above, the CPU 232 may be one of any form of general-purpose computer processor that can be used in an industrial setting, such as a programmable logic controller (PLC), for controlling various chambers and sub-processors. The memory 234 is coupled to the CPU 232 and the memory 234 is non-transitory and may be one or more of readily available memory such as random access memory (RAM), read only memory (ROM), floppy disk drive, hard disk, or any other form of digital storage, local or remote. Support circuits 236 may be coupled to the CPU 232 for supporting the processor in a conventional manner. Implantation and other processes are generally stored in the memory 234, typically as a software routine. The software routine may also be stored and/or executed by a second CPU (not shown) that is remotely located from the hardware being controlled by the CPU 232.

The memory 234 is in the form of computer-readable storage media that contains instructions, that when executed by the CPU 232, facilitates the operation of the apparatus 200. The instructions in the memory 234 are in the form of a program product such as a program that implements the method of the present disclosure. The program code may conform to any one of a number of different programming languages. In one example, the disclosure may be implemented as a program product stored on computer-readable storage media for use with a computer system. The program(s) of the program product define functions of the embodiments (including the methods described herein). Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

It is to be understood that the various layers, structures, and regions shown in the accompanying drawings are schematic illustrations. For ease of explanation, one or more layers, structures, and regions of a type commonly used to form semiconductor devices or structures may not be explicitly shown in a given drawing. This does not imply that any layers, structures, and/or regions not explicitly shown are omitted from the actual semiconductor structures.

In various embodiments, design tools can be provided and configured to create the datasets used to pattern the semiconductor layers of the device 100, e.g., as described herein. For example, data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance running software, or implemented in hardware.

As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading the Detailed Description, the various features and functionality described herein may be implemented in any given application and can be implemented in one or more separate or shared modules in various combinations and permutations. Although various features or elements of functionality may be individually described or claimed as separate modules, one of ordinary skill in the art will understand these features and functionality can be shared among one or more common software and hardware elements.

For the sake of convenience and clarity, terms such as "top," "bottom," "upper," "lower," "vertical," "horizontal," "lateral," and "longitudinal" will be understood as describing the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporating the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of ordinary skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

As used herein, "depositing" and/or "deposited" may include any now known or later developed techniques appropriate for the material to be deposited including yet not limited to, for example: chemical vapor deposition (CVD), low-pressure CVD (LPCVD), and plasma-enhanced CVD (PECVD). Additional techniques may include semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), and sputtering deposition. Additional techniques may include ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:

1. A method, comprising:
   providing a device structure including a well formed in an epitaxial layer;
   forming a plurality of trenches through the well and the epitaxial layer;
   implanting the device structure to form a treated layer along a sidewall of just an upper portion of the device structure within each of the plurality of trenches;
   etching the device structure to remove the treated layer; and
   forming a gate oxide layer within each of the plurality of trenches.

2. The method of claim 1, further comprising:
   forming a sacrificial oxide within each of the plurality of trenches;
   removing the sacrificial oxide; and
   annealing a bottom surface of each of the plurality of trenches, wherein the gate oxide layer is formed within each of the plurality of trenches after the annealing.

3. The method of claim 2, further comprising forming the sacrificial oxide along the sidewall of the upper portion and along a lower portion of the plurality of trenches.

4. The method of claim 3, wherein implanting the device structure comprises an angled ion implant delivered to the upper portion of the device structure within each of the plurality of trenches at a non-zero angle of inclination relative to a perpendicular extending from a top surface of the device structure.

5. The method of claim 4, wherein the non-zero angle of inclination prevents the treated layer from being formed along the lower portion of each of the plurality of trenches.

6. The method of claim 1, wherein forming the gate oxide layer comprises thermally oxidizing the device structure.

7. The method of claim 1, further comprising forming a gate material over the gate oxide layer within each of the plurality of trenches.

8. The method of claim 1, further comprising providing a source region over the well, wherein the plurality of trenches are formed through the epitaxial layer, the well, and the source region.

9. A method of forming a MOSFET, comprising:
   providing a device structure including a well formed in an epitaxial layer;
   forming a plurality of trenches through the well and the epitaxial layer;
   implanting the plurality of trenches with an ion implant delivered to the device structure at a non-zero angle of inclination relative to a perpendicular extending from a top surface of the device structure, wherein the ion implant forms a treated layer along a well sidewall within each of the plurality of trenches;
   etching the device structure to remove the treated layer from the well sidewall; and
   forming a gate oxide layer within each of the plurality of trenches.

10. The method of claim 9, further comprising:
    forming a sacrificial oxide within each of the plurality of trenches;
    removing the sacrificial oxide; and
    annealing a bottom surface of each of the plurality of trenches, wherein the gate oxide layer is formed within each of the plurality of trenches after the annealing.

11. The method of claim 10, further comprising forming the sacrificial oxide along the well sidewall and along a sidewall of the epitaxial layer.

12. The method of claim 11, wherein the non-zero angle of inclination prevents the treated layer from being formed along the sidewall of the epitaxial layer.

13. The method of claim 9, wherein forming the gate oxide layer comprises thermally oxidizing the device structure.

14. The method of claim 9, further comprising forming a gate material over the gate oxide layer within each of the plurality of trenches.

15. The method of claim 9, further comprising providing a source region over the well, wherein the plurality of trenches are formed through the epitaxial layer, the well, and the source region.

16. A method for reducing MOSFET trench sidewall surface roughness, comprising:
    providing a device structure including a well formed in an epitaxial layer;
    forming a plurality of trenches through the well and the epitaxial layer;
    implanting the device structure to form a treated layer along a sidewall of just an upper portion of the device structure within each of the plurality of trenches; and
    etching the device structure to remove the treated layer selective to a top surface of the epitaxial layer.

17. The method of claim 16, wherein implanting the device structure comprises an angled ion implant delivered to the upper portion of the device structure within each of the plurality of trenches at a non-zero angle of inclination relative to a perpendicular extending from the top surface of the device structure.

18. The method of claim 16, further comprising:
forming a sacrificial oxide within each of the plurality of trenches;
removing the sacrificial oxide;
annealing a bottom surface of each of the plurality of trenches; and
forming a gate oxide layer within each of the plurality of trenches after the annealing.

19. The method of claim 18, further comprising forming the sacrificial oxide along the sidewall of the upper portion and along a lower portion of the plurality of trenches.

20. The method of claim 18, further comprising forming a gate material directly atop the gate oxide layer within each of the plurality of trenches.

\* \* \* \* \*